United States Patent
Ide et al.

(10) Patent No.: US 7,643,254 B2
(45) Date of Patent: Jan. 5, 2010

(54) TUNNEL-EFFECT TYPE MAGNETIC SENSOR HAVING FREE LAYER INCLUDING NON-MAGNETIC METAL LAYER

(75) Inventors: Yosuke Ide, Niigaka-ken (JP); Naoya Hasegawa, Niigata-ken (JP); Masamichi Saito, Niigata-ken (JP); Ryo Nakabayashi, Niigata-ken (JP); Yoshihiro Nishiyama, Niigaka-ken (JP); Kazumasa Nishimura, Niigaka-ken (JP); Hidekazu Kobayashi, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 502 days.

(21) Appl. No.: 11/671,819

(22) Filed: Feb. 6, 2007

(65) Prior Publication Data
US 2008/0158739 A1 Jul. 3, 2008

(30) Foreign Application Priority Data
Dec. 28, 2006 (JP) .............................. 2006-355043

(51) Int. Cl.
*G11B 5/39* (2006.01)
(52) U.S. Cl. ...................................... 360/324
(58) Field of Classification Search ................. 360/324, 360/324.2
See application file for complete search history.

(56) References Cited

U.S. PATENT DOCUMENTS

| | | | |
|---|---|---|---|
| 6,738,235 B1 * | 5/2004 | Mao | 360/324 |
| 7,253,994 B2 * | 8/2007 | Kagami et al. | 360/324.1 |
| 7,408,746 B2 * | 8/2008 | Sato | 360/322 |
| 7,528,457 B2 * | 5/2009 | Horng et al. | 257/421 |
| 2004/0150921 A1 * | 8/2004 | Kagami et al. | 360/324.1 |
| 2005/0094320 A1 * | 5/2005 | Sano | 360/319 |
| 2006/0018056 A1 * | 1/2006 | Sato | 360/322 |

FOREIGN PATENT DOCUMENTS

JP 2006-261637 9/2006

* cited by examiner

*Primary Examiner*—Allen T Cao
(74) *Attorney, Agent, or Firm*—Brinks Hofer Gilson & Lione

(57) ABSTRACT

A free magnetic layer of a tunnel-effect type magnetic sensor is formed on an insulating barrier layer made of Mg—O, and the free magnetic layer includes an enhancement layer, a first soft magnetic layer, a non-magnetic metal layer, and a second soft magnetic layer, which are laminated in that order from the bottom. For example, the enhancement layer is formed of Co—Fe, the first and the second soft magnetic layers are formed of Ni—Fe, and the non-magnetic metal layer is formed of Ta. The average thickness of the first soft magnetic layer is formed in the range of 5 to 60 Å. Accordingly, a high resistance change rate ($\Delta R/R$) can be obtained.

9 Claims, 8 Drawing Sheets

UPPER COLUMN: THICKNESS T2 OF
                FIRST SOFT MAGNETIC LAYER (Å)

(LOWER COLUMN): TOTAL THICKNESS T3 (Å)

TUNNEL-EFFECT TYPE MAGNETIC SENSOR HAVING FREE LAYER INCLUDING NON-MAGNETIC METAL LAYER

This application claims the benefit of priority under 35 U.S.C. § 119 to Japanese Patent Application No. 2006-355043, filed Dec. 28, 2006, which is hereby incorporated by reference in its entirety.

BACKGROUND OF THE INVENTION

1. Field of the Invention

The present invention relates to magnetic sensors using a tunnel effect, which sensors are mounted in hard disc devices, other magnetic sensing devices and the like, and more particularly, the invention relates to a tunnel-effect type magnetic sensor capable of increasing a resistance change rate ($\Delta R/R$).

2. Description of the Related Art

A tunnel-effect type magnetic sensor (TMR element) is a sensor which changes its resistance using a tunnel effect, in which when the magnetization of a fixed magnetic layer and that of a free magnetic layer are antiparallel to each other. A tunnel current is unlikely to flow through an insulating barrier layer (tunnel barrier layer) provided between the fixed magnetic layer and the free magnetic layer, so that the electrical resistance is maximized, and when the magnetization of the fixed magnetic layer and that of the free magnetic layer are parallel to each other, the tunnel current is most likely to flow, so that the electrical resistance is minimized.

By using the above principle, the change in electrical resistance by the change in magnetization of the free magnetic layer, which is caused by influence of an exterior magnetic field, is detected as the change in electrical voltage, so that a magnetic field leakage from a recording medium is detected. Related art is disclosed, for example, in Japanese Unexamined Patent Application Publication No. 2006-261637 (hereinafter referred to as "Patent Document 1")

In Patent Document 1, a tunnel-effect type magnetic sensor has been disclosed in which a free magnetic layer has a laminated ferrimagnetic structure.

According to Patent Document 1, in order to generate a sufficiently large exchange coupling between ferromagnetic layers which form the free magnetic layer, a first orientation control buffer is formed in one of the ferromagnetic layers. For example, in paragraph [0139] of Patent Document 1, an example has been disclosed in which $Ni_{81}Fe_{19}$ (2 nm), Ta (0.4 nm), $Ni_{81}Fe_{19}$ (2 nm), Ru (2.1 nm), and $Ni_{81}Fe_{19}$ (4 nm) are laminated in that order from the bottom to form the free magnetic layer.

However, in the invention disclosed in Patent Document 1, the structure for increasing the resistance change rate ($\Delta R/R$) has not been disclosed.

SUMMARY OF THE INVENTION

Accordingly, the present invention solves that above problems, and an object of the present invention is to provide a tunnel-effect type magnetic sensor capable of increasing the resistance change rate ($\Delta R/R$).

A tunnel-effect type magnetic sensor according to the present invention includes: a laminate which includes a laminate portion composed of a fixed magnetic layer in which its magnetization direction is fixed, an insulating barrier layer, and a free magnetic layer in which its magnetization direction is changed with respect to an exterior magnetic field, with the layers being laminated in that order from the bottom or from the top. In the tunnel-effect type magnetic sensor described above, the insulating barrier layer is formed of Mg—O, the free magnetic layer is formed of a plurality of soft magnetic layers which are laminated together, at least one non-magnetic metal layer provided at each place between the soft magnetic layers, and an enhancement layer which has a spin polarizability higher than that of the soft magnetic layers and which is located between the insulating barrier layer and a first soft magnetic layer, which is one of the soft magnetic layers provided at a position closest to the insulating barrier layer. The soft magnetic layers are magnetically coupled together and are all magnetized in the same direction, and the average thickness of the first soft magnetic layer is in the range of 5 to 60 Å.

In the tunnel-effect type magnetic sensor according to the present invention in which the insulating barrier layer is formed of Mg—O, the free magnetic layer includes the enhancement layer, the non-magnetic metal layer is provided between the soft magnetic layers which form the free magnetic layer, and the average thickness of the first soft magnetic layer is set in an appropriate range. As a result, the resistance change rate ($\Delta R/R$) can be effectively increased as compared to that obtained in the past.

In the present invention, unlike the invention disclosed in Patent Document 1, the free magnetic layer is not formed to have a laminated ferrimagnetic structure. When the free magnetic layer has a laminated ferrimagnetic structure, for example, an antiparallel magnetization state between two magnetic layers facing each other with a non-magnetic interlayer provided therebetween is disordered by a bias magnetic field in one direction applied to the free magnetic layer from hard bias layers located at two sides thereof in a track width direction, and as a result, Barkhausen noise is liable to be generated. In addition, although the coercive force of the free magnetic layer is preferably decreased as much as possible, when the free magnetic layer has a laminated ferrimagnetic structure, the coercive force is liable to be increased.

According to the present invention, although the non-magnetic metal layer is provided between the soft magnetic layers, the non-magnetic metal layer is formed having a small thickness so as to ensure magnetic coupling between the soft magnetic layers and so as to magnetize all the soft magnetic layers in the same direction. Accordingly, since the magnetic coupling between the soft magnetic layers is not broken by the presence of the non-magnetic metal layer, and in addition, the laminated ferrimagnetic structure is not formed, Barkhausen noise can be suppressed, and the coercive force can also be decreased, so that stable reproducing properties can be obtained.

In addition, in the present invention, the average thickness of the first soft magnetic layer is preferably more than 10 Å. As a result, a high resistance change rate ($\Delta R/R$) can be obtained in a stable manner.

In addition, in the present invention, the average thickness of the first soft magnetic layer is preferably less than 20 Å. As a result, compared to the structure of a related art in which although the enhancement layer and the soft magnetic layers are provided to form the free magnetic layer, the non-magnetic metal layer is not provided therefor, and the resistance change rate ($\Delta R/R$) can be increased.

In addition, in the present invention, the average thickness of the enhancement layer is preferably in the range of 2 to 30 Å. Accordingly, the resistance change rate ($\Delta R/R$) can be effectively increased.

In addition, in the present invention, it is preferable when the average thickness of the enhancement layer is 10 Å or more, since the resistance change rate ($\Delta R/R$) can be more effectively increased.

In the present invention, the non-magnetic metal layer preferably includes at least one of Ti, V, Zr, Nb, Mo, Hf, Ta, and W. In addition, the non-magnetic metal layer more preferably includes Ta. Accordingly, the resistance change rate ($\Delta R/R$) can be effectively increased.

In the present invention, the average thickness of the non-magnetic metal layer is preferably in the range of 1 to 4 Å. Accordingly, for example, the soft magnetic layers can be magnetically coupled together in an appropriate manner, a high resistance change rate ($\Delta R/R$) can be maintained, and in addition, Barkhausen noise can be appropriately suppressed; hence, the stability of reproducing properties can be improved.

In the present invention, since a high resistance change rate ($\Delta R/R$) can be effectively obtained, it is preferable that the non-magnetic metal layer include a Ni—Fe alloy and that the enhancement layer include a Co—Fe alloy.

The tunnel-effect type magnetic sensor according to the present invention can increase the resistance change rate ($\Delta R/R$) as compared to that obtained in the past.

DESCRIPTION OF THE PREFERRED EMBODIMENTS

Figure 1:
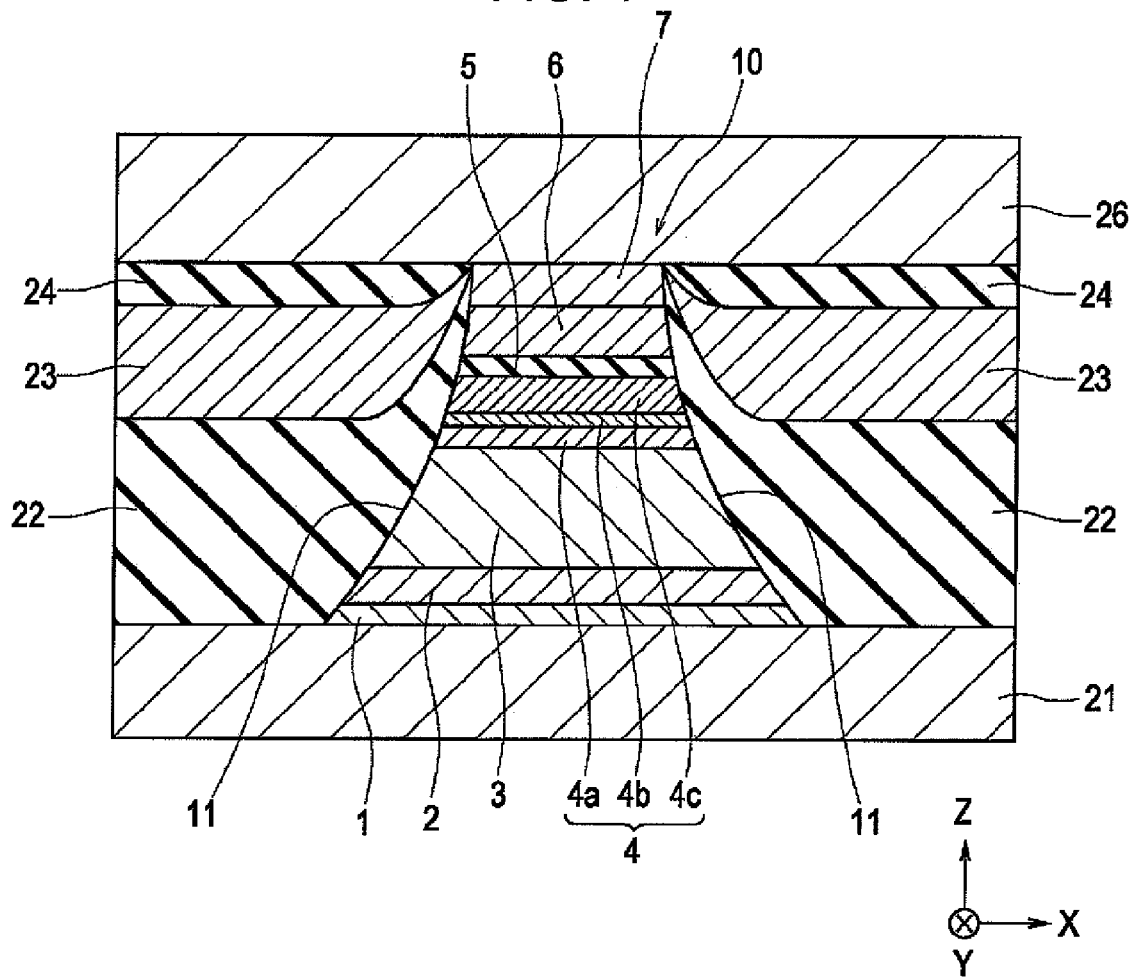
FIG. 1 is a cross-sectional view of a tunnel-effect type magnetic sensor, which is taken along a direction parallel to a facing face facing a recording medium.
Figure 2:
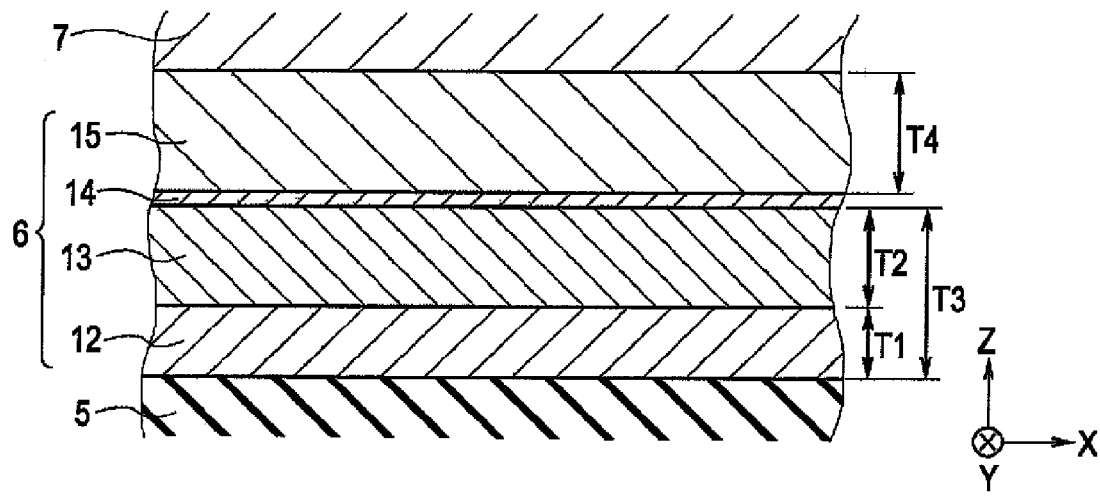
FIG. 2 is a partial enlarged cross-sectional view showing the structure of a tunnel-effect type magnetic sensor according to a first embodiment, which is taken along the same direction as that in FIG. 1.

FIG. 1 is a cross-sectional view of a tunnel-effect type magnetic sensor according to this embodiment, which is taken along a direction parallel to a facing surface facing to a recording medium, and FIG. 2 is a partial enlarged cross-sectional view of a part of the tunnel-effect type magnetic sensor shown in FIG. 1, which primarily shows a free magnetic layer. In FIG. 1, although the free magnetic layer is shown as if it has a single layer structure, a laminate structure shown in FIG. 2 is actually formed.

A tunnel-effect type magnetic sensor is, for example, provided for a trailing-side end portion of a floating type slider provided for a hard disc device, and functions to detect a magnetic field leakage (recording magnetic field) from a magnetic recording medium. In addition, an X direction shown in the figure indicates a track width direction, a Y direction indicates a direction (height direction) of a magnetic field leakage from the magnetic recording medium, and a Z direction indicates a moving direction of the magnetic recording medium and a lamination direction of layers forming the tunnel-effect type magnetic sensor.

A lowermost layer in FIG. 1 is a lower shield layer 21 formed, for example, of a Ni—Fe alloy. On the lower shield layer 21, a laminate 10 is formed. The tunnel-effect type magnetic sensor is formed of the laminate 10 and also includes lower-side insulating layers 22, hard bias layers 23, and upper-side insulating layers 24, which are formed at two sides of the laminate 10 in the track width direction (the X direction shown in the figure).

A lowest layer of the laminate 10 is an underlayer 1 formed of at least one type of non-magnetic element selected from the group consisting of Ta, Hf, Nb, Zr, Ti, Mo, and W. On this underlayer 1, a seed layer 2 is provided. The seed layer 2 is formed of Ni—Fe—Cr, Cr, or Ru. In addition, the underlayer 1 may not be present.

An antiferromagnetic layer 3 formed on the seed layer 2 is preferably formed of an antiferromagnetic material containing Mn and an element X (where the element X is at least one element selected from the group consisting of Pt, Pd, Ir, Rh, Ru, and Os).

In addition, the antiferromagnetic layer 3 may also be formed of an antiferromagnetic material containing Mn, the element X, and an element X' (where the element X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and a rare earth element).

The antiferromagnetic layer 3 is formed, for example, of Ir—Mn.

On the antiferromagnetic layer 3, a fixed magnetic layer 4 is formed. The fixed magnetic layer 4 has a laminated ferrimagnetic structure in which a first fixed magnetic layer 4a, a non-magnetic interlayer 4b, and a second fixed magnetic layer 4c are laminated, in that order from the bottom. Magnetization directions of the first fixed magnetic layer 4a and the second fixed magnetic layer 4c are antiparallel to each other by an antiferromagnetic exchange coupling magnetic field (RKKY interaction) with the non-magnetic interlayer 4b provided therebetween, and an exchange coupling magnetic field (Hex) at the interface with the antiferromagnetic layer 3. Since the fixed magnetic layer 4 is formed to have a laminated ferrimagnetic structure, the magnetization of the fixed magnetic layer 4 can be stabilized. In addition, the exchange coupling magnetic field generated at the interface between the fixed magnetic layer 4 and the antiferromagnetic layer 3 can be apparently increased. The first fixed magnetic layer 4a and the second fixed magnetic layer 4c are each formed, for example, to have a thickness of approximately 10 to 40 Å, and the non-magnetic interlayer 4b is formed to have a thickness of approximately 8 to 10 Å.

The first fixed magnetic layer 4a and the second fixed magnetic layer 4c are formed of a ferromagnetic material, such as Co—Fe, Ni—Fe, or Co—Fe—Ni. In addition, the non-magnetic interlayer 4b is formed of a non-magnetic conductive material, such as Ru, Rh, Ir, Cr, Re, or Cu.

On the fixed magnetic layer 4, an insulating barrier layer 5 made of Mg—O (magnesium oxide) is formed. In addition, on the insulating barrier layer 5, a free magnetic layer 6 is formed. The structure of the free magnetic layer 6 will be described hereinafter.

The width dimension of the free magnetic layer 6 in the track width direction (the X direction shown in the figure) determines a track width Tw.

On the free magnetic layer 6, a protective layer 7 made of Ta or the like is formed.

Two end surfaces 11 of the laminate 10 in the track width direction (the X direction shown in the figure) are each formed to have inclined surfaces so that the width dimension in the track width direction is gradually decreased from the bottom to the top sides.

As shown in FIG. 1, over the lower shield layer 21 extended to the two sides of the laminate 10 and over the two end surfaces 11 of the laminate 10, the lower-side insulating layers 22 are formed, and on each of the lower-side insulating layers 22, the hard bias layer 23 and the upper-side insulating layer 24, are formed in that order from the bottom.

Between the lower insulating layer 22 and the hard bias layer 23, a bias underlayer (not shown) may also be formed. The bias underlayer is formed, for example, of Cr, W, or Ti.

The insulating layers 22 and 24 are formed of an insulating material, such as $Al_2O_3$ or $SiO_2$. The insulating layers 22 and 24 insulate the top and the bottom of the hard bias layer 23 in order to suppress a current, which flows in a direction perpendicular to the interfaces between the layers of the laminate 10, from being shunted to the two sides thereof in the track width direction. The hard bias layer 23 is formed, for example, of a Co—Pt (cobalt-platinum) alloy or a Co—Cr—Pt (cobalt-chromium-platinum) alloy Over the laminate 10 and the upper-side insulating layers 24, an upper shield layer 26 made of a Ni—Fe alloy or the like is formed.

In the embodiment shown in FIG. 1, the lower shield layer 21 and the upper shield layer 26 function as electrode layers for the laminate 10, and a current is allowed to flow in a direction perpendicular to the film surfaces of the layers of the laminate 10 (in a direction parallel to the Z direction shown in the figure).

The free magnetic layer 6 is magnetized in a direction parallel to the track width direction (the X direction shown in the figure) since it receives a bias magnetic field from the hard bias layers 23. On the other hand, the first fixed magnetic layer 4a and the second fixed magnetic layer 4c, which form the fixed magnetic layer 4, are magnetized in a direction parallel to the height direction (the Y direction shown in the figure). Since the fixed magnetic layer 4 is a laminated ferrimagnetic structure, the first fixed magnetic layer 4a and the second fixed magnetic layer 4c are magnetized antiparallel to each other. Although the magnetization of the fixed magnetic layer 4 is fixed (magnetization is not changed by an exterior magnetic field), the magnetization of the free magnetic layer 6 is changed by an exterior magnetic field.

When the magnetization of the free magnetic layer 6 is changed by an exterior magnetic field, and when the magnetization of the second fixed magnetic layer 4c and that of the free magnetic layer 6 are antiparallel to each other, a tunnel current is unlikely to flow through the insulating barrier layer 5 provided between the second fixed magnetic layer 4c and the free magnetic layer 6, and as a result, the electrical resistance is maximized. On the other hand, when the magnetization of the second fixed magnetic layer 4c and that of the free magnetic layer 6 are parallel to each other, the tunnel current is most likely to flow, and as a result, the electrical resistance is minimized.

By using the above principle, the change in electrical resistance by the change in magnetization of the free magnetic layer 6, which is caused by the influence of an exterior magnetic field, is detected as the change in electrical voltage, so a magnetic field leakage from a magnetic recording medium is detected.

Characteristics of the tunnel-effect type magnetic sensor according to this embodiment will be described.

As shown in FIG. 2, the free magnetic layer 6 is formed of an enhancement layer 12, a first soft magnetic layer 13, a non-magnetic metal layer 14, and a second soft magnetic layer 15, which are laminated in that order from the bottom.

The enhancement layer 12 is formed of a magnetic material having a spin polarizability larger than that of the first soft magnetic layer 13, and the second soft magnetic layer 15 and is preferably formed of a Co—Fe alloy. When the enhancement layer 12 is not present, it has been known that a resistance change rate ($\Delta R/R$) is considerably decreased. Accordingly, the enhancement layer 12 is an important layer. When a Fe concentration of the Co—Fe alloy forming the enhancement layer 12 is increased, a high resistance change rate ($\Delta R/R$) can be obtained. The Fe concentration of the Co—Fe alloy is preferably in the range of 25 to 100 atomic percent.

The first soft magnetic layer 13 and the second soft magnetic layer 15 are formed of a material having superior soft magnetic properties, such as a low coercive force and a low anisotropic magnetic field, to those of the enhancement layer 12. Although the first soft magnetic layer 13 and the second soft magnetic layer 15 may be formed from different soft magnetic materials, they are both preferably formed of a Ni—Fe alloy. A Fe concentration of the Ni—Fe alloy is preferably in the range of 10 to 20 atomic percent.

The non-magnetic metal layer 14 is formed of at least one non-magnetic metal material selected from the group consisting of Ti, V, Zr, Nb, Mo, Hf, Ta, and W. When at least two of the above non-magnetic metal materials are selected, the non-magnetic metal layer 14 is formed, for example, of an alloy or is formed to have a laminate structure containing layers each made of one of the above non-magnetic metal materials.

In this embodiment, the non-magnetic metal layer 14 is preferably formed of Ta.

The non-magnetic metal layer 14 is formed to have a small thickness so that the first soft magnetic layer 13 and the second soft magnetic layer 15 are magnetically coupled, and are both magnetized in the same direction. For example, the first soft magnetic layer 13 and the second soft magnetic layer 15 are both magnetized in the X direction shown in the figure. In this case, the enhancement layer 12 is also magnetized in the X direction shown in the figure.

The average thickness of the non-magnetic metal layer 14 is preferably set in the range of 1 to 4 Å. When the average thickness of the non-magnetic metal layer 14 is less than 1 Å, and an effect of increasing the resistance change rate ($\Delta R/R$) cannot be expected. In addition, when the average thickness of the non-magnetic metal layer 14 is more than 4 Å, since the magnetic coupling between the first soft magnetic layer 13 and the second soft magnetic layer 15 is liable to be broken, the stability of reproducing properties is degraded such that Barkhausen noise is liable to be generated. Accordingly, in this embodiment, the average thickness of the non-magnetic metal layer 14 is preferably in the range of 1 to 4 Å. In addition, when the average thickness of the non-magnetic metal layer 14 is set in the range of 1 to 4 Å, RA product of element resistance R and an area A) is approximately equal to or slightly lower than that of a conventional structure in which the non-magnetic metal layer 14 is not formed.

The average thickness of the non-magnetic metal layer 14 is very small as described above. Hence, unlike the case shown in FIG. 2, the non-magnetic metal layer 14 is not formed to have a uniform thickness and may be formed intermittently on the first soft magnetic layer 13. In addition, since the non-magnetic metal layer 14 is intermittently formed, a magnetic coupling force (ferromagnetic coupling) between the first soft magnetic layer 13 and the second soft magnetic layer 15 can be further increased. In addition, since the average thickness of the non-magnetic metal layer 14 indicates a thickness obtained by averaging thicknesses thereof over the entire surface of the first soft magnetic layer 13, when the non-magnetic metal layer 14 is intermittently formed on the first soft magnetic layer 13, the "average thickness" is defined including positions (pinhole portions) at which the non-magnetic metal layer 14 is not formed on the first soft magnetic layer 13.

As shown in FIG. 2, the average thickness of the enhancement layer 12 is represented by T1, and the average thickness of the first soft magnetic layer 13 is represented by T2. In addition, a total thickness of the average thickness T1 of the enhancement layer 12 and the average thickness T2 of the first soft magnetic layer 13 is represented by T3. In this embodiment, the average thickness T2 of the first soft magnetic layer 13 is set in the range of 5 to 60 Å.

In this embodiment, the insulating barrier layer 5 is formed of Mg—O as described above. In the Mg—O, the Mg composition ratio is preferably in the range of 40 to 60 atomic percent, and $Mg_{50at\%}O_{50at\%}$ is most preferable.

In addition, in a tunnel-effect type magnetic sensor in which the insulating barrier layer 5 is formed of Mg—O, when the enhancement layer 12 of the free magnetic layer 6 is formed at a side in contact with the insulating barrier layer 5, the non-magnetic metal layer 14 made, for example, Ta is provided between the soft magnetic layers 13 and 15, which form the free magnetic layer 6, and the average thickness T2 of the first soft magnetic layer 13 is set in the range of 5 to 60 Å. Compared to the case in the past the resistance change rate ($\Delta R/R$) can be effectively increased. In addition, at this stage, the RA can be set to be approximately equal to that obtained heretofore, and the change in RA can be suppressed.

The reasons the resistance change rate ($\Delta R/R$) is increased are believed as follows. As a first reason, it is believed that since the non-magnetic metal layer 14 preferentially form chemical bonds with oxygen atoms which are diffused from the insulating barrier layer 5 into the soft magnetic layers 13 and 14 and the enhancement layer 12, the oxygen concentration in the soft magnetic layers 13 and 14 and the enhancement layer 12 is decreased, and as a result, band structures thereof are each placed in an appropriate state, so that the spin polarizability is improved. As a second reason, it is believed that since a stress applied to the interface with the insulating barrier layer 5 and/or a lattice strain thereof is changed, the spin polarizability at the interface with the insulating barrier layer 5 is improved.

In this embodiment, the second soft magnetic layer 15 on the non-magnetic metal layer 14 can be effectively formed to have a face-centered cubic structure (fcc structure) in which equivalent crystal planes represented by the {111} plane are preferentially oriented in a direction parallel to the film surface (X-Y plane surface).

In addition, in the tunnel-effect type magnetic sensor in which the insulating barrier layer 5 is formed using Mg—O, in order to improve the resistance change rate ($\Delta R/R$), it is important that the enhancement layer 12 be formed to have a body-centered cubic structure (bcc structure) in which equivalent crystal planes represented by the {100} plane are preferentially oriented in a direction parallel to the film surface (X-Y plane surface).

On the other hand, the soft magnetic layer (Ni—Fe alloy layer) formed on the enhancement layer 12 is preferably formed to have a face-centered cubic structure (fcc structure) in which equivalent crystal planes represented by the {111} plane are preferentially oriented in a direction parallel to the film surface (X-Y plane surface). In this case, in the crystal structure of the enhancement layer 12, a crystal strain may be generated due to influence of the crystal structure of the soft magnetic layer (Ni—Fe alloy layer) located on the enhancement layer 12.

In this embodiment, the non-magnetic metal layer 14 is provided between the soft magnetic layers 13 and 15. Hence, the thickness of the first soft magnetic layer 13 in contact with the enhancement layer 12 is smaller than that obtained when the first soft magnetic layer 13 and the second soft magnetic layer 15 are united together without forming the non-magnetic metal layer 14. As a result, the influence of the non-magnetic metal layer (Ni—Fe alloy layer) on the crystal structure of the enhancement layer 12 is decreased. It is also believed that his decrease in influence is partly responsible to increase the resistance change rate ($\Delta R/R$).

In this embodiment, the average thickness T2 of the first soft magnetic layer 13 is preferably more than 10 Å. In this case, a high resistance change rate ($\Delta R/R$) can be stably obtained.

In addition, in this embodiment, the average thickness T2 of the first soft magnetic layer 13 is preferably less than 20 Å.

Accordingly, the increase in resistance change rate (ΔR/R) of this embodiment can be made larger than that of a related structure in which the non-magnetic metal layer 14 is removed from the free magnetic layer 6 shown in FIG. 2, and the resistance change rate (ΔR/R) can be effectively increased.

In this embodiment, when the thickness T2 of the first soft magnetic layer 13 is in the range of more than 10 Å to less than 20 Å, the resistance change rate (ΔR/R) can be most effectively increased.

On the other hand, in order to effectively increase the resistance change rate (ΔR/R), the average thickness T1 of the enhancement layer 12 is preferably in the range of 2 to 30 Å. In addition, the average thickness T1 of the enhancement layer 12 is preferably in the range of 10 to 30 Å.

The total thickness T3 of the average thickness T2 of the first soft magnetic layer 13 and the average thickness T1 of the enhancement layer 12 is preferably in the range of 15 to 70 Å. The average thickness T2 of the first soft magnetic layer 13 is preferably 34% to 85% of the total thickness T3.

In addition, in this embodiment, the total thickness T3 is preferably in the range of more than 20 Å to 70 Å. In this case, the average thickness T2 of the first soft magnetic layer 13 is preferably more than 50% to 85% of the total thickness T3.

In addition, the total thickness T3 is preferably in the range of 15 Å to less than 30 Å. In this case, the average thickness T2 of the first soft magnetic layer 13 is preferably 34% to less than 66% of the total thickness T3.

In this embodiment, the total thickness T3 is most preferable in the range of more than 20 Å to less than 30 Å. In this case, the average thickness T2 of the first soft magnetic layer 13 is preferably more than 50% to less than 66% of the total thickness T3.

An average thickness T4 of the second soft magnetic layer 15 is preferably in the range of 20 to 60 Å.

In the embodiment shown in FIGS. 1 and 2, although the antiferromagnetic layer 3, the fixed magnetic layer 4, the insulating barrier layer 5, the free magnetic layer 6, and the protective layer 7 are laminated in that order from the bottom, the free magnetic layer 6, the insulating barrier layer 5, the fixed magnetic layer 4, the antiferromagnetic layer 3, and the protective layer 7 may also be laminated in that order.

In the case described above, as shown in FIG. 3, the free magnetic layer 6 is formed of the second soft magnetic layer 15, the non-magnetic metal layer 14, the first soft magnetic layer 13, and the enhancement layer 12, which are laminated in that order from the bottom, and on the free magnetic layer 6, the insulating barrier layer 5 is formed. The thicknesses and materials of the layers forming the free magnetic layer 6 are the same as described above.

Alternatively, a lower-side antiferromagnetic layer, a lower-side fixed magnetic layer, a lower-side insulating barrier layer, a free magnetic layer, an upper-side insulating barrier layer, an upper-side fixed magnetic layer, and an upper-side antiferromagnetic layer may be laminated in that order from the bottom to form a dual tunnel-effect type magnetic sensor.

In the case described above, as shown in FIG. 4, the free magnetic layer 6 is formed of the enhancement layer 12, the first soft magnetic layer 13, the non-magnetic metal layer 14, a second soft magnetic layer 25, and an enhancement layer 27, which are laminated in that order from the bottom. Under the enhancement layer 12, which is the lower part of the free magnetic layer 6, a lower-side insulating barrier layer 17 is formed, and on the enhancement layer 27, which is the upper part of the free magnetic layer 6, an upper-side insulating barrier layer 18 is formed. The thicknesses and materials of the layers forming the free magnetic layer 6 are the same as described above. In the case shown in FIG. 4, an average thickness T6 of the second soft magnetic layer 25 at the upper side is set in the range of 5 to 60 Å as the average thickness T2 of the first soft magnetic layer 13 at the lower side.

Figure 3:
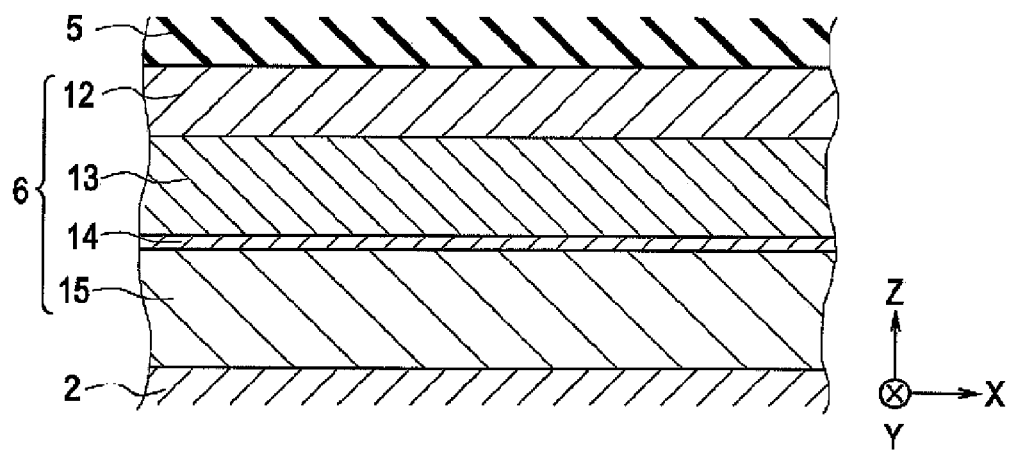
FIG. 3 is a partial enlarged cross-sectional view showing the structure of a tunnel-effect type magnetic sensor according to a second embodiment, which is taken along the same direction as that in FIG. 1.
Figure 4:
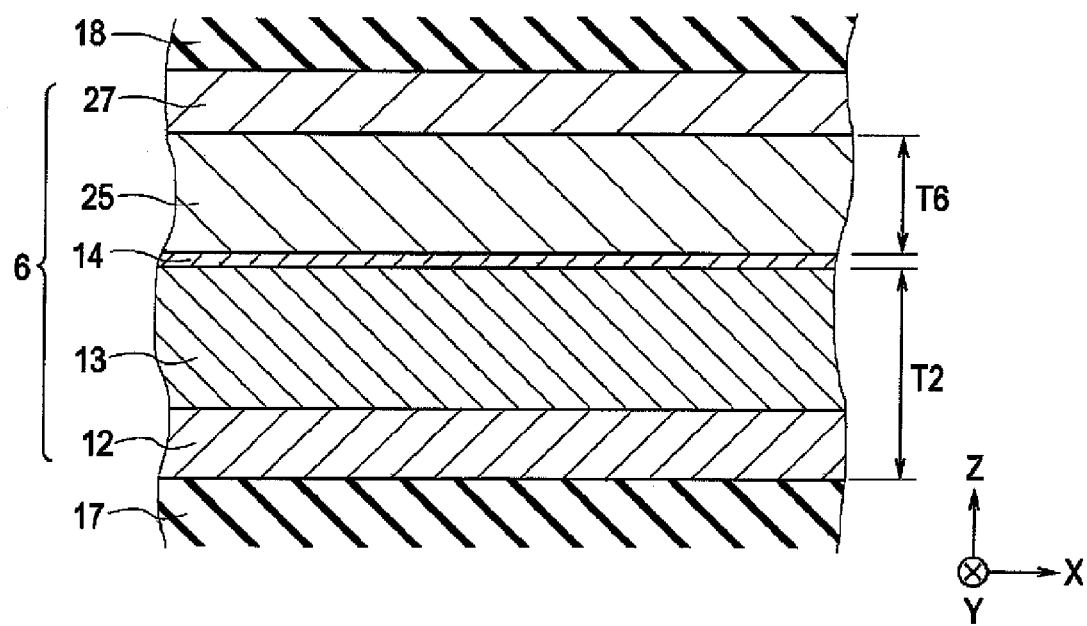
FIG. 4 is a partial enlarged cross-sectional view showing the structure of a tunnel-effect type magnetic sensor according to a third embodiment, which is taken along the same direction as that in FIG. 1.

In the embodiments shown in FIGS. 2 to 4, although the number of the non-magnetic metal layers 14 formed in the free magnetic layer 6 is one, at least two non-magnetic metal layers 14 may also be formed. When the number of the non-magnetic metal layers 14 is at least two, a laminate structure is formed containing a soft magnetic layer, a non-magnetic metal layer, a soft magnetic layer, a non-magnetic metal layer, a soft magnetic layer, and so on.

However, when the number of the non-magnetic metal layers 14 is increased, for example, a sufficient effect of increasing the resistance change rate (ΔR/R) may not be expected, and the change in RA may be increased; hence, it is believed that only one non-magnetic metal layer 14 be preferably formed in the free magnetic layer 6.

In this embodiment when the insulating barrier layer 5 is formed of Mg—O, and the fixed magnetic layer 4, the insulating barrier layer 5, and the free magnetic layer 6 are laminated in that order from the bottom as shown in FIG. 1, in order to effectively obtain a high resistance change rate (ΔR/R), the second fixed magnetic layer 4c is preferably formed of Co—Fe—B. The second fixed magnetic layer 4c is preferably formed of $(Co_{100-\alpha}Fe_\alpha)_\beta B_{100-\beta}$, in which an atomic ratio α is 25 to 100, and a composition ratio β is 70 to 90 atomic percent. Accordingly, the second fixed magnetic layer 4c can be appropriately formed to have an amorphous structure or an amorphous dominant structure. As a result, the insulating barrier layer 5 and the enhancement layer 12, which are provided on the second fixed magnetic layer 4c, are appropriately formed to have a body-centered cubic structure (bcc structure) in which equivalent crystal planes represented by the {100} plane are preferably oriented in a direction parallel to the film surface (X-Y plane surface), and hence a high resistance change rate (ΔR/R) can be obtained.

In addition, the protective layer 7 may be formed having a single layer structure of Ta, which has been generally used. However, when the protective layer 7 has the structure formed of Ru and Ta laminated in that order from the bottom, a high resistance change rate (ΔR/R) can be obtained in a stable manner.

Figure 6:
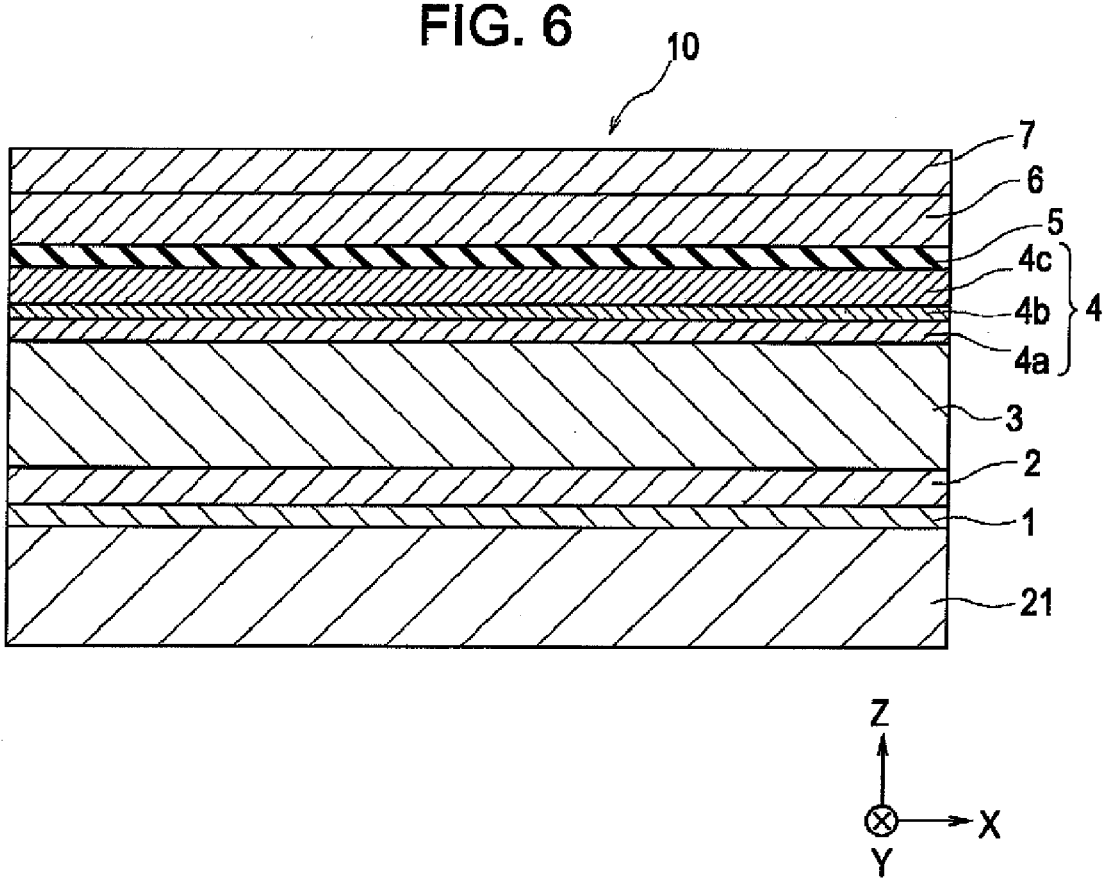
FIG. 6 is a view showing a step (cross-sectional view) following the step shown in FIG. 5.
Figure 7:
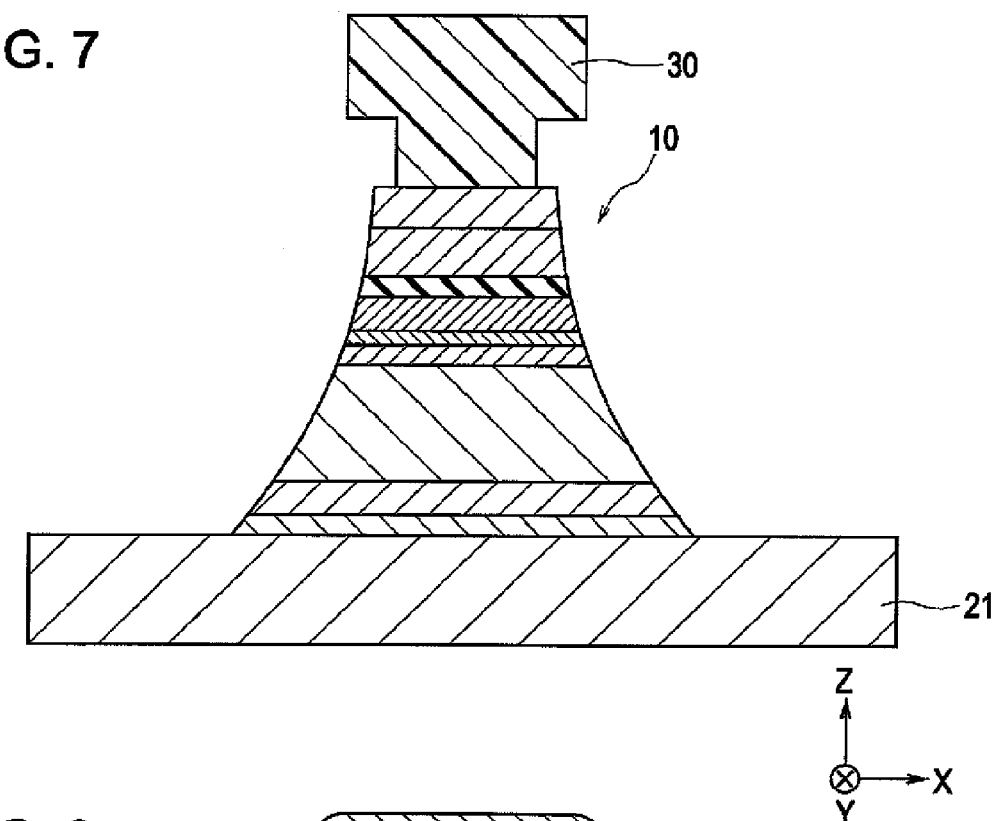
FIG. 7 is a view showing a step (cross-sectional view) following the step shown in FIG. 6.
Figure 8:
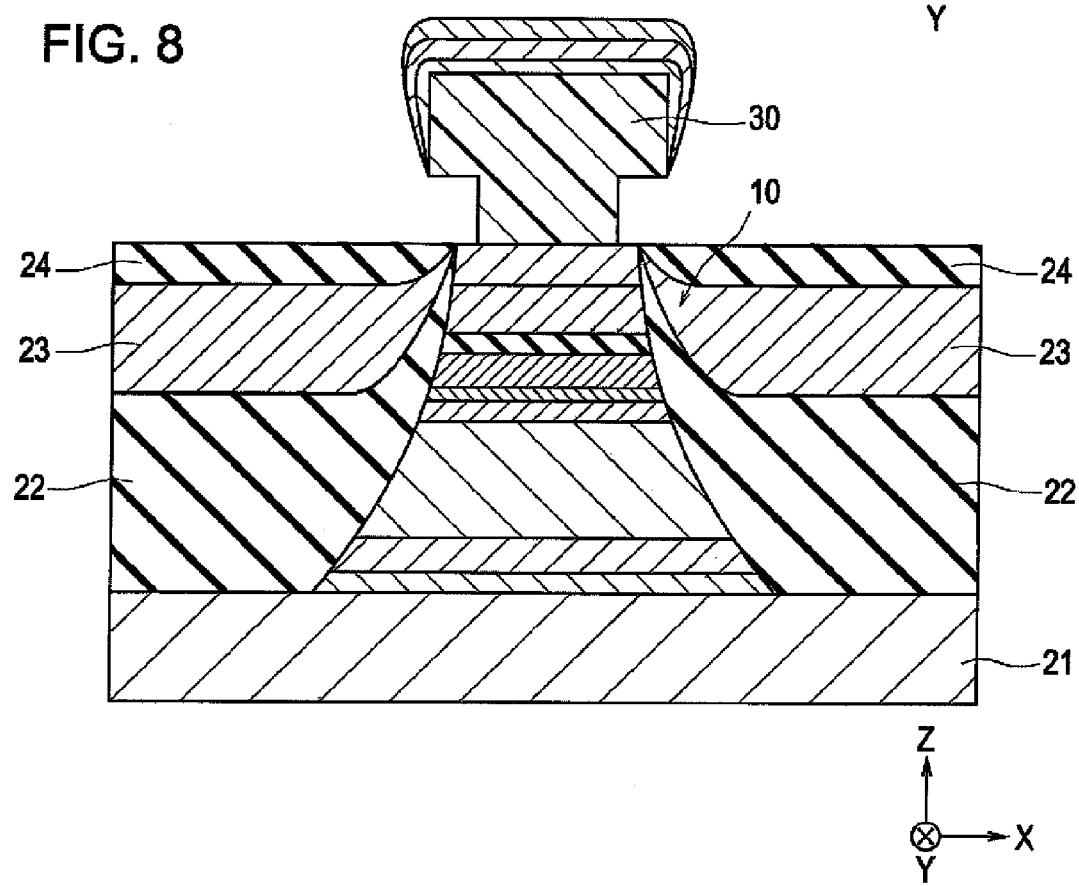
FIG. 8 is a view showing a step (cross-sectional view) following the step shown in FIG. 7.

A method for manufacturing the tunnel-effect type magnetic sensor according to this embodiment will be described. FIGS. 5 to 8 are partial cross-sectional views of a tunnel-effect type magnetic sensor in process, and the cross-sectional views each show the same position as that of the tunnel-effect type magnetic sensor shown in FIG. 1. Although a free magnetic layer in FIGS. 6 to 8 is shown as if it has a single layer structure, the free magnetic layer is actually formed as a laminate structure, as shown in FIG. 2.

Figure 5:
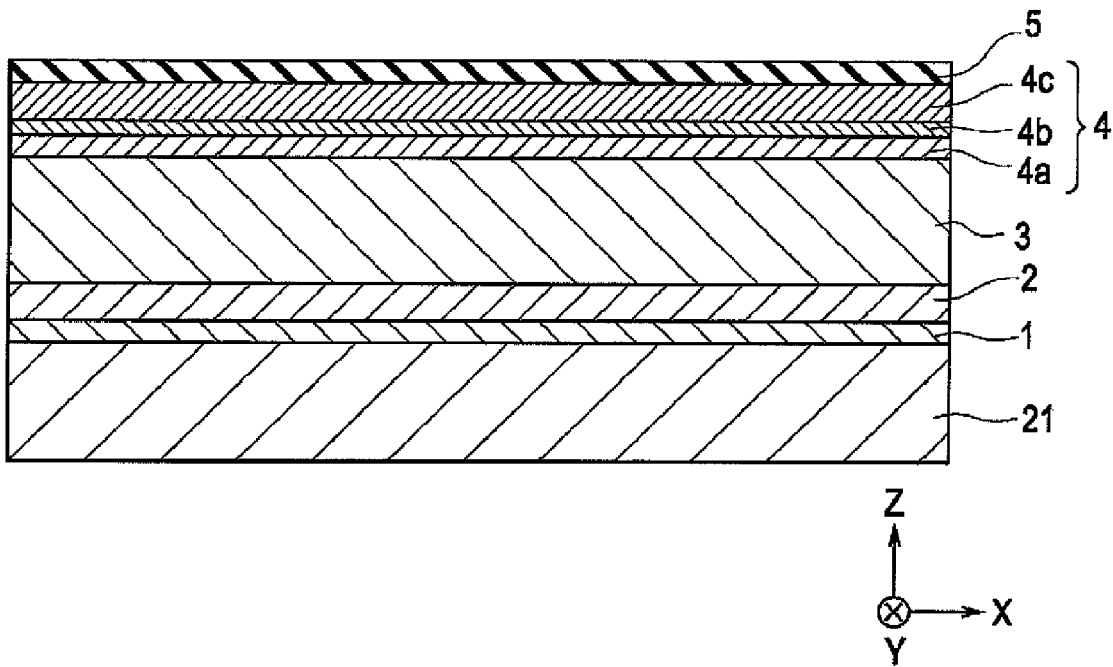
FIG. 5 is a cross-sectional view of a tunnel-effect type magnetic sensor in process, which is taken along the same direction as that in FIG. 1.

In a step shown in FIG. 5, on the lower shield layer 21, the underlayer 1, the shield layer 2, the antiferromagnetic layer 3, the first fixed magnetic layer 4a, the non-magnetic interlayer 4b, and the second fixed magnetic layer 4c are sequentially formed in the order from the bottom.

Next, as shown in FIG. 5, on the second fixed magnetic layer 4c, the insulating barrier layer 5 made of Mg—O (magnesium oxide) is formed. The insulating barrier layer 5 is obtained, for example, by sputtering Mg—O on the second fixed magnetic layer 4c using an Mg—O target having a predetermined composition ratio.

Next, as shown in FIG. 6, on the insulating barrier layer 5, the free magnetic layer 6 and the protective layer 7 are formed.

In this embodiment, as shown in FIG. 2, the free magnetic layer 6 is formed by laminating the enhancement layer 12, the first soft magnetic layer 13, the non-magnetic metal layer 14, and the second soft magnetic layer 15 in that order from the bottom. It is preferable that the enhancement layer 12 be formed of a Co—Fe alloy, the first and the second soil magnetic layers 13 and 15 be formed of a Ni—Fe alloy, and the non-magnetic metal layer 14 be formed of Ta.

When the free magnetic layer 6 is formed, as described with reference to FIG. 2, the average thickness T1 of the enhancement layer 12 is formed in the range of 2 to 30 Å, and the average thickness T2 of the first soft magnetic layer 13 is formed in the range of 5 to 60 Å and is preferably formed to be more than 10 Å or less than 20 Å. In addition, the non-magnetic metal layer 14 is formed to have a small thickness, such as 1 to 4 Å, so that the first and the second soft magnetic layers 13 and 15 are magnetically coupled and are magnetized in the same direction.

Accordingly, the laminate 10 including the layers from the underlayer 1 to the protective layer 7 is formed.

Next, on the laminate 10, a lift-off resist layer 30 is formed, and two end portions of the laminate 10 in the track width direction (the X direction in the figure), which are not covered with the lift-off resist layer 30, are removed by etching or the like (see FIG. 7).

Next, on the lower shield layer 21 at two sides of the laminate 10 in the track width direction (the X direction in the figure), the lower-side insulating layers 22, the hard bias layers 23, and the upper-side insulating layers 24 are laminated in that order from the bottom (see FIG. 8).

Subsequently, after the lift-off resist layer 30 is removed, the upper shield layer 26 is formed on the laminate 10 and the upper-side insulating layers 24.

The method for manufacturing a tunnel-effect type magnetic sensor, described above, includes an annealing treatment performed after the laminate 10 is formed. A typical annealing treatment is an annealing treatment to generate an exchange coupling magnetic field (Hex) between the antiferromagnetic layer 3 and the first fixed magnetic layer 4a.

The structure described with reference to FIG. 3 in which the free magnetic layer 6, the insulating barrier layer 5, and the fixed magnetic layer 4 are laminated in that order from the bottom and the dual type structure described with reference to FIG. 4 are manufactured generally in accordance with the manufacturing method described with reference to FIGS. 5 to 8.

The tunnel-effect type magnetic sensor according to this embodiment may also be used as a magnetoresistive random access memory (MRMA) and a magnetic sensing device besides a magnetic head embedded in a hard disc device.

EXAMPLE 1

A tunnel-effect type magnetic sensor having the following laminate was formed as shown in FIG. 2, the laminate including a free magnetic layer formed of the enhancement layer 12, the first soft magnetic layer 13, the non-magnetic metal layer 14, and the second soft magnetic layer 15 laminated in that order from the bottom.

The laminate described above included an underlayer 1 of Ta(30), a seed layer 2 of Ru(40), an antiferromagnetic layer 3 of $Ir_{26atm\%}Mn_{74atom\%}$(80), a fixed magnetic layer 4 (a first fixed magnetic layer 4a of $Fe_{30atm\%}Co_{70atom\%}$(14), a non-magnetic interlayer 4b of Ru (9.1), and a second fixed magnetic layer 4c of $\{Co_{50}Fe_{50}\}_{80atm\%}B_{20atm\%}$(18)), an insulating barrier layer 5 of $Mg_{50atm\%}O_{50atom\%}$(11), a free magnetic layer 6 (an enhancement layer 12 of $Fe_{50atm\%}Co_{50atom\%}$(10), a first soft magnetic layer 13 of $Ni_{86atm\%}Fe_{14atom\%}$(X), a non-magnetic metal layer 14 of Ta(3), and a second soft magnetic layer 15 of $Ni_{86atm\%}Fe_{14atom\%}$(60−X)), and a protective layer 7 of Ru(20) and Ta(180), which were laminated in that order from the bottom.

In the experiment, the insulating barrier layer 5 was formed by sputtering using a target made of Mg—O. The numerals in brackets of the individual layers of the laminate each indicate the average thickness, and the unit thereof is angstrom represented by Å.

After the above laminate was formed, an annealing treatment was performed at 270° C. for 220 minutes.

COMPARATIVE EXAMPLE 1

A tunnel-effect type magnetic sensor was formed which had the same laminate as that in Example 1 except that the enhancement layer 12 was not formed.

CONVENTIONAL EXAMPLE 1

A tunnel-effect type magnetic sensor was formed which had the same laminate as that in Example 1 except that the non-magnetic metal layer 14 was not formed.

Figure 9:
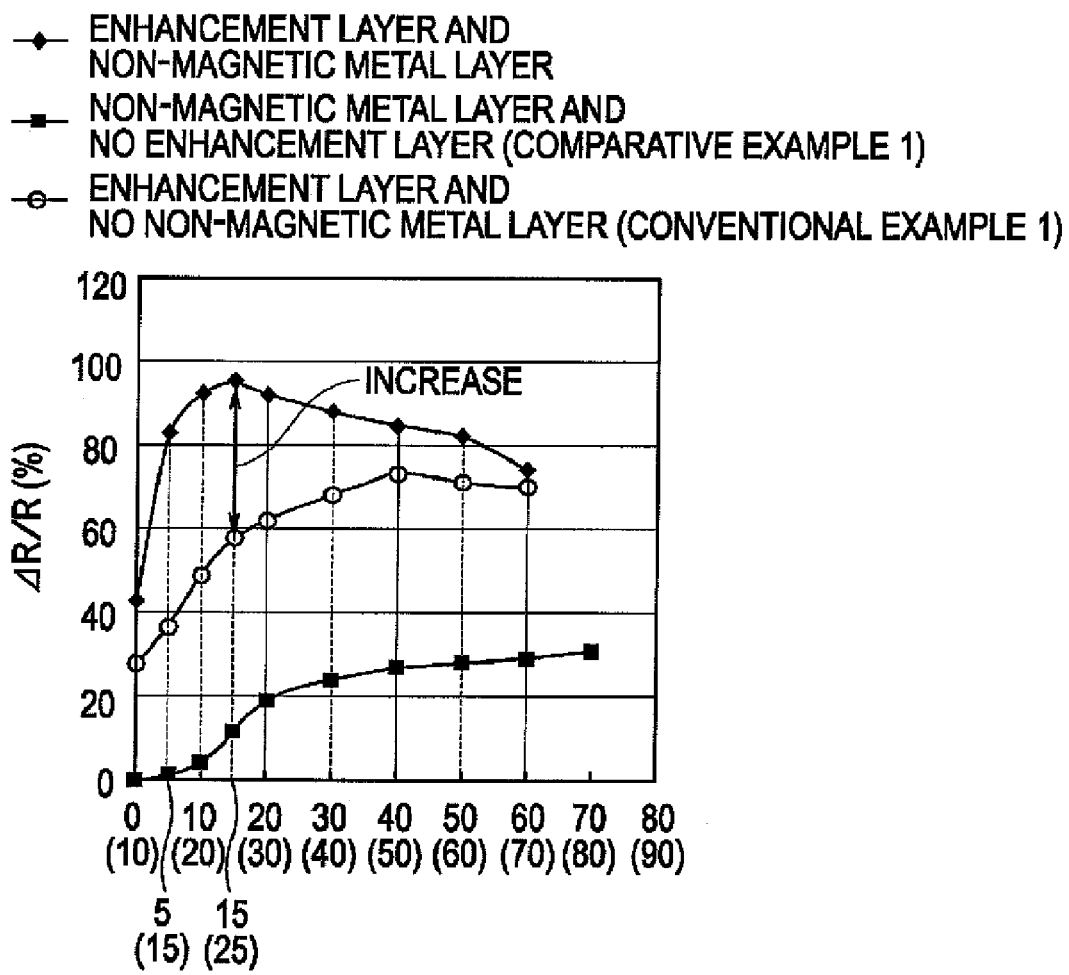
FIG. 9 is a graph showing the relationship between a resistance change rate ($\Delta R/R$) and an average thickness T2 of a first soft magnetic layer of each of tunnel-effect type magnetic sensors obtained in the case in which a non-magnetic metal layer and an enhancement layer are both provided for forming a free magnetic layer, the case in which the non-magnetic metal layer is not formed and the enhancement layer is provided for forming the free magnetic layer (Conventional Example 1), and the case in which the non-magnetic metal layer is formed for forming the free magnetic layer and the enhancement layer is not provided (Comparative Example 1)

In the experiment, the resistance change rate (ΔR/R) was measured by changing the average thickness of the first soft magnetic layer 13. FIG. 9 is a graph showing the relationship between the average thickness T2 (upper column along the horizontal axis) of the first soft magnetic layer 13 and the resistance change rate (ΔR/R). In addition, besides the average thickness T2 of the first soft magnetic layer 13, the total thickness T3 (see FIG. 2) of the average thickness T2 of the first soft magnetic layer 13 and the average thickness T1 of the enhancement layer 12 is also shown in brackets along the horizontal axis.

As shown in FIG. 9, it was found that in Comparative Example 1 and Conventional Example 1, as the average thickness T2 of the first soft magnetic layer 13 is increased, the resistance change rate (ΔR/R) is gradually increased. In addition, it was also found that the resistance change rate (ΔR/R) obtained in Conventional Example 1, in which the enhancement layer 12 is provided although the non-magnetic metal layer 14 is not formed in the free magnetic layer 6, is increased as compared to the that obtained in Comparative Example 1 in which although the non-magnetic metal layer 14 is formed in the free magnetic layer 6, the enhancement layer 12 is not provided. Accordingly, it was understood that in order to effectively increase the resistance change rate (ΔR/R), it is necessary that the enhancement layer 12 be provided at a side at which the free magnetic layer 6 is in contact with the insulating barrier layer.

As shown in FIG. 9, in the case in which the non-magnetic metal layer 14 was formed in the free magnetic layer 6, and the enhancement layer 12 was also provided, it was found that when the average thickness T2 of the first soft magnetic layer 13 is increased to approximately 15 Å, the resistance change rate (ΔR/R) is rapidly increased. In addition, it was also found that when the average thickness T2 of the first soft magnetic layer 13 is increased to more than 15 Å, the resistance change rate (ΔR/R) is gradually decreased.

As shown in FIG. 9, in the case in which the non-magnetic metal layer 14 was formed in the free magnetic layer 6, and the enhancement layer 12 was also provided, it was found that when the average thickness T2 of the first soft magnetic layer 13 is set in the range of 5 to 60 Å, the resistance change rate (ΔR/R) can be effectively increased. In addition, when the average thickness T2 of the first soft magnetic layer 13 is decreased to 10 Å or less, the change in resistance change rate ($\Delta R/R$) is considerably large, and as a result, the resistance change rate ($\Delta R/R$) is rapidly changed by a slight change in thickness of the first soft magnetic layer 13 Accordingly, the average thickness T2 of the first soft magnetic layer 13 is preferably more than 10 Å.

In addition, as shown in FIG. 9, in the case in which the non-magnetic metal layer 14 was formed in the free magnetic layer 6, and the enhancement layer 12 was also provided, it was found that when the average thickness T2 of the first soft magnetic layer 13 is increased to 20 Å or more, the resistance change rate ($\Delta R/R$) is gradually approaches that shown in Conventional Example 1. Hence, in order to increase the resistance change rate ($\Delta R/R$) as compared to that of Conventional Example 1, it was found that the average thickness T2 of the first soft magnetic layer 13 is preferably decreased to less than 20 Å.

Accordingly, in the case in which the non-magnetic metal layer 14 was formed in the free magnetic layer 6, and the enhancement layer 12 was also provided, the average thickness T2 of the first soft magnetic layer 13 was set in the range of 5 to 60 Å in this example. In addition, the total thickness T3 of the average thickness (X) of the first soft magnetic layer 13 and the average thickness of the enhancement layer 12 was set in the range of 15 to 70 Å. In addition, in this example, the average thickness T2 of the first soft magnetic layer 13 is set in the range of more than 10 to 60 Å or in the range of 5 Å to less than 20 Å as a preferable range. In addition, the total thickness T3 is set in the range of more than 20 to 70 Å or in the range of 15 Å to less than 30 Å as a preferable range. Furthermore, in this example, the average thickness T2 of the first soft magnetic layer 13 is set in the range of more than 10 Å to less than 20 Å as the most preferred range. In addition, the total thickness T3 is set in the range of more than 20 Å to less than 30 Å as the most preferable range.

When the upper limit of the average thickness T2 of the first soft magnetic layer 13 is set to 60 Å, according to the structure of the laminate used in the experiment, the average thickness T4 of the second soft magnetic layer 15 is decreased to 0 Å. However, according to the following experiment, in the structure in which the second soft magnetic layer 15 is formed, even when the average thickness T2 of the first soft magnetic layer 13 is set to 60 Å, a high resistance change rate ($\Delta R/R$) can be stably obtained. Accordingly, the upper limit of the average thickness T2 of the first soft magnetic layer 13 is set to 60 Å.

EXAMPLE 2

As shown in FIG. 2, a tunnel-effect type magnetic sensor was formed which had the following laminate: a free magnetic layer in which the enhancement layer 12, the first soft magnetic layer 13, the non-magnetic metal layer 14, and the second soft magnetic layer 15 were laminated in that order from the bottom.

The laminate was formed of an underlayer 1 of Ta(30), a seed layer 2 of Ru(40), an antiferromagnetic layer 3 of $Ir_{26atm\%}Mn_{74atom\%}(80)$, a fixed magnetic layer 4 (a first fixed magnetic layer 4a of $Fe_{30atm\%}Co_{70atom\%}(14)$, a non-magnetic interlayer 4b of Ru (9.1), and a second fixed magnetic layer 4c of $\{Co_{50}Fe_{50}\}_{80atm\%}B_{20atm\%}(18)$), an insulating barrier layer 5 of $Mg_{50atm\%}O_{50atom\%}(11)$, a free magnetic layer 6 (an enhancement layer 12 of $Fe_{50atm\%}Co_{50atom\%}(10)$, a first soft magnetic layer 13 of $Ni_{86atm\%}Fe_{14atom\%}(X)$, a non-magnetic metal layer 14 of Ta(3), and a second soft magnetic layer 15 of $Ni_{86atm\%}Fe_{14atom\%}(20)$), and a protective layer 7 of Ru(20) and Ta(180), which were laminated in that order from the bottom.

In the experiment, the insulating barrier layer 5 was formed by sputtering using an Mg—O target. The numerals in brackets of the individual layers forming the above laminate each indicate the average thickness, and the unit thereof is angstrom represented by Å.

After the laminate was formed, an annealing treatment was performed at 270° C. for 220 minutes.

Figure 10:
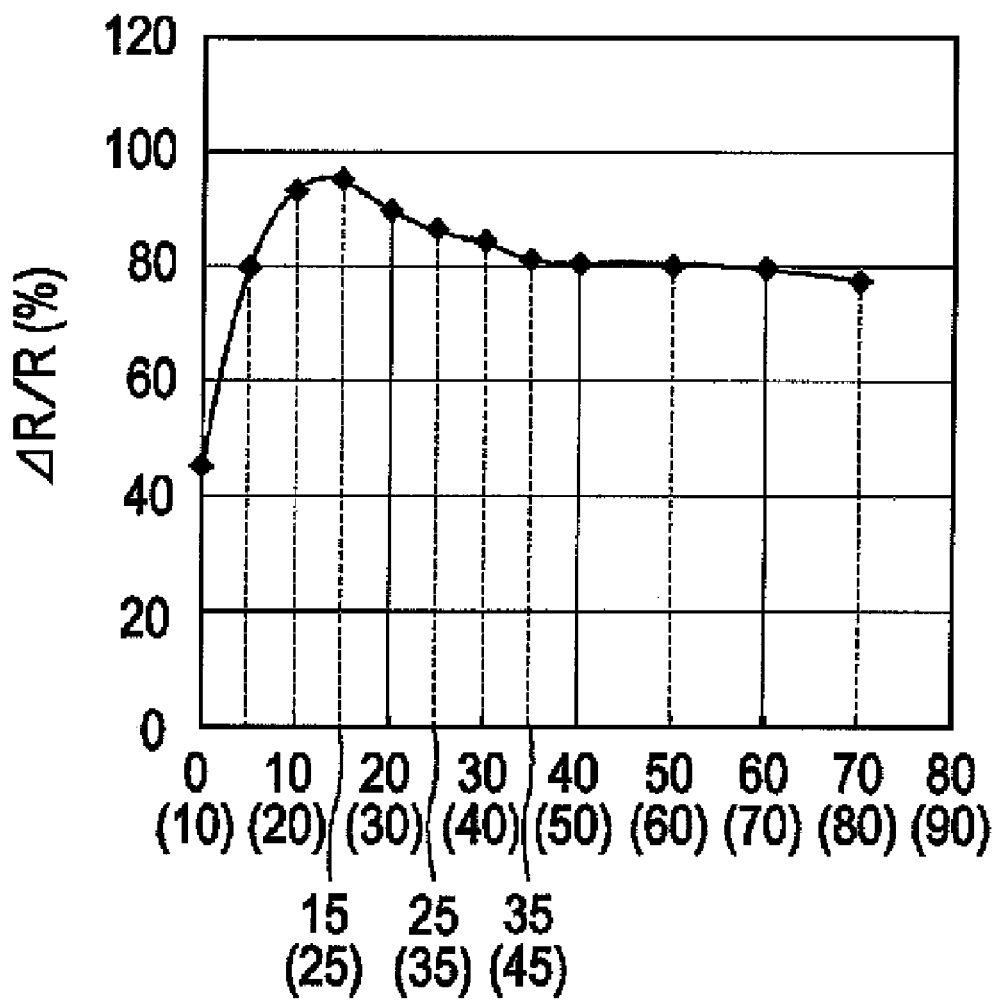
FIG. 10 is a graph showing the relationship between the resistance change rate ($\Delta R/R$) and the average thickness T2 of the first soft magnetic layer in the case different from that shown in FIG. 9, in which the non-magnetic metal layer and the enhancement layer are both provided for forming the free magnetic layer.

In the experiment, the resistance change rate ($\Delta R/R$) was measured by changing the average thickness T2 of the first soft magnetic layer 13. FIG. 10 is a graph showing the relationship between the average thickness T2 (upper column along the horizontal axis) of the first soft magnetic layer 13 and the resistance change rate ($\Delta R/R$). In addition, besides the average thickness T2 of the first soft magnetic layer 13, the total thickness T3 (see FIG. 2) of the average thickness T2 of the first soft magnetic layer 13 and the average thickness T1 of the enhancement layer 12 is also shown in brackets along the horizontal axis.

In the previous experiment described above, although a total thickness of the average thickness T2 of the first soft magnetic layer 13 and the average thickness T4 of the second soft magnetic layer 15 was fixed to 60 Å, in this experiment, the average thickness T4 of the second soft magnetic layer 15 was set to 20 Å, and the resistance change rate ($\Delta R/R$) was measured with the change in thickness of the first soft magnetic layer 13.

As shown in FIG. 10, the dependence of the resistance change rate ($\Delta R/R$) on the thickness of the first soft magnetic layer is almost equivalent to that shown in FIG. 9.

Accordingly, it was found that when the average thickness T2 of the first soft magnetic layer 13 is set in the range of 5 to 60 Å, a high resistance change rate ($\Delta R/R$) can be obtained. In addition, it was also found that the average thickness T2 of the first soft magnetic layer 13 is preferably set in the range of more than 10 to 60 Å or in the range of 5 Å to less than 20 Å, and that the average thickness T2 is most preferably set in the range of more than 10 Å to less than 20 Å.

EXAMPLE 3

As shown in FIG. 2, a tunnel-effect type magnetic sensor was formed which had the following laminate including a free magnetic layer in which the enhancement layer 12, the first soft magnetic layer 13, the non-magnetic metal layer 14, and the second soft magnetic layer 15 were laminated in that order from the bottom.

The laminate described above included an underlayer 1 of Ta(30), a seed layer 2 of Ru(40), an antiferromagnetic layer 3 of $Ir_{26atm\%}Mn_{74atom\%}(80)$, a fixed magnetic layer 4 (a first fixed magnetic layer 4a of $Fe_{30atm\%}Co_{70atom\%}(14)$, a non-magnetic interlayer 4b of Ru (9.1), and a second fixed magnetic layer 4c of $\{Co_{50}Fe_{50}\}_{80atm\%}B_{20atm\%}(18)$), an insulating barrier layer 5 of $Mg_{50atm\%}O_{50atom\%}(11)$, a free magnetic layer 6 (an enhancement layer 12 of $Fe_{50atm\%}Co_{50atom\%}(Y)$, a first soft magnetic layer 13 of $Ni_{86atm\%}Fe_{14atom\%}(20)$, a non-magnetic metal layer 14 of Ta(3), and a second soft magnetic layer of $Ni_{86atm\%}Fe_{14atom\%}(40)$), and a protective layer 7 of Ru(20) and Ta(180), which were laminated in that order from the bottom.

In the experiment, the insulating barrier layer 5 was formed by sputtering using a target made of Mg—O. The numerals in brackets of the individual layers of the laminate each indicate the average thickness, and the unit thereof is angstrom represented by Å.

After the above laminate was formed, an annealing treatment was performed at 270° C. for 220 minutes.

In the experiment, the resistance change rate (ΔR/R) was measured as the average thickness T1 of the enhancement layer 12 was changed.

CONVENTIONAL EXAMPLE 2

A tunnel-effect type magnetic sensor was formed which had the same laminate as that in Example 3 except that the non-magnetic metal layer 14 was not formed. Subsequently, the resistance change rate (ΔR/R) was measured as the average thickness T1 of the enhancement layer 12 was changed.

Figure 11:
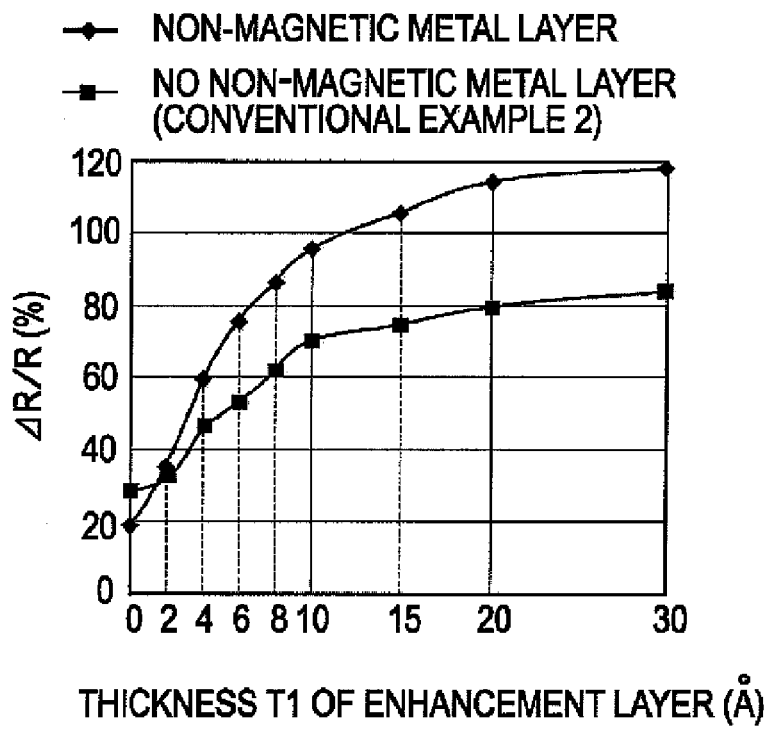
FIG. 11 is a graph showing the relationship between the resistance change rate ($\Delta R/R$) and an average thickness T1 of the enhancement layer of each of tunnel-effect type magnetic sensors obtained in the case in which the non-magnetic metal layer and the enhancement layer are both provided for forming the free magnetic layer, and the case in which the enhancement layer is provided for forming the free magnetic layer and the non-magnetic metal layer is not formed (Conventional Example 2)

FIG. 11 is a graph showing the relationship between the average thickness T1 of the enhancement layer 12 and the resistance change rate (ΔR/R).

As shown in FIG. 11, when the non-magnetic metal layer 14 was formed in the free magnetic layer 6, it was found that when the average thickness T1 of the enhancement layer 12 is increased, the resistance change rate (ΔR/R) is further increased as compared to that of Conventional Example 2 in which the nonmagnetic metal layer 14 was not formed.

As shown in FIG. 11, in the structure in which the non-magnetic metal layer 14 was formed in the free magnetic layer 6, it was found that when the average thickness T1 of the enhancement layer 12 is set to 2 Å or more, a high resistance change rate (ΔR/R) can be obtained as compared to that obtained in Conventional Example 2. Accordingly, from the results shown in FIG. 11, in this example, the average thickness T1 of the enhancement layer 12 was set in the range of 2 to 30 Å.

In addition, the average thickness T1 of the enhancement layer 12 was set in the range of 10 to 30 Å as a preferable range.

EXAMPLE 4

As shown in FIG. 2, a tunnel-effect type magnetic sensor was formed which had the following laminate: a free magnetic layer in which the enhancement layer 12, the first soft magnetic layer 13, the non-magnetic metal layer 14, and the second soft magnetic layer 15 were laminated in that order from the bottom.

The laminate was formed of an underlayer 1 of Ta(30), a seed layer 2 of Ru(40), an antiferromagnetic layer 3 of $Ir_{26atm\%}Mn_{74atom\%}$(80), a fixed magnetic layer 4 (a first fixed magnetic layer 4a of $Fe_{30atm\%}Co_{70atom\%}$(14), a non-magnetic interlayer 4b of Ru (9.1), and a second fixed magnetic layer 4c of $\{Co_{50}Fe_{50}\}_{80atm\%}B_{20atm\%}$(18)), an insulating barrier layer 5 of $Mg_{50atm\%}O_{50atom\%}$(11), a free magnetic layer 6 (an enhancement layer 12 of $Fe_{50atm\%}Co_{50atom\%}$(10), a first soft magnetic layer 13 of $Ni_{86atm\%}Fe_{14atom\%}$(20), a non-magnetic metal layer 14 of Ta(Z), and a second soft magnetic layer 15 of $Ni_{86atm\%}Fe_{14atom\%}$(40)), and a protective layer 7 of Ru(20) and Ta(180), which were laminated in that order from the bottom.

In the experiment, the insulating barrier layer 5 was formed by sputtering using an Mg—O target. The numerals in brackets of the individual layers forming the above laminate each indicate the average thickness, and the unit thereof is angstrom represented by Å.

After the laminate was formed, an annealing treatment was performed at 270° C. for 220 minutes.

In the experiment, the relationship between the resistance change rate (ΔR/R) and the RA of the tunnel-effect type magnetic sensor was measured when the average thickness of the non-magnetic metal layer 14 was set to 1, 2, 3, or 4 Å.

CONVENTIONAL EXAMPLE 3

A tunnel-effect type magnetic sensor was formed which had the same laminate as that in Example 4 except that the non-magnetic metal layer 14 was not formed. In addition, in Conventional Example 3, the thickness of the insulating barrier layer 5 was changed in manufacturing, so that four types of tunnel-effect type magnetic sensors were formed. Subsequently, the relationship between the resistance change rate (ΔR/R) and the RA of each tunnel-effect type magnetic sensor was measured.

Figure 12:
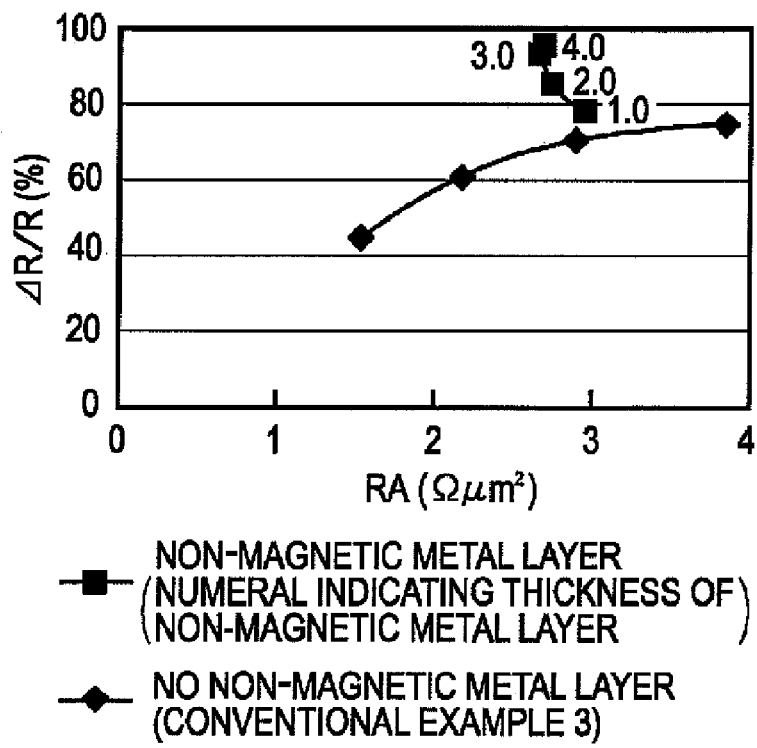
FIG. 12 is a graph showing the relationship between the resistance change rate ($\Delta R/R$) and RA of a tunnel-effect type magnetic sensor of Example 4, in which the enhancement layer and a non-magnetic metal layer of Ta having a thickness of 1, 2, 3, or 4 Å are both provided for forming the free magnetic layer, and a tunnel-effect type magnetic sensor of Conventional Example 3 in which the enhancement layer is provided for forming the free magnetic layer and the non-magnetic metal layer is not formed.

FIG. 12 is a graph showing the relationship between the resistance change rate (ΔR/R) and the RA of each of the tunnel-effect type magnetic sensors obtained in Example 4 and Conventional Example 3.

As shown in FIG. 12, it was found that the RA of the tunnel-effect type magnetic sensor of Example 4 is within the range of the RA of the tunnel-effect type magnetic sensor of Conventional Example 3. In addition, it was also found that the resistance change rate (ΔR/R) of the tunnel-effect type magnetic sensor of Example 4 is higher than that of the tunnel-effect type magnetic sensor of Conventional Example 3.

Figure 13:
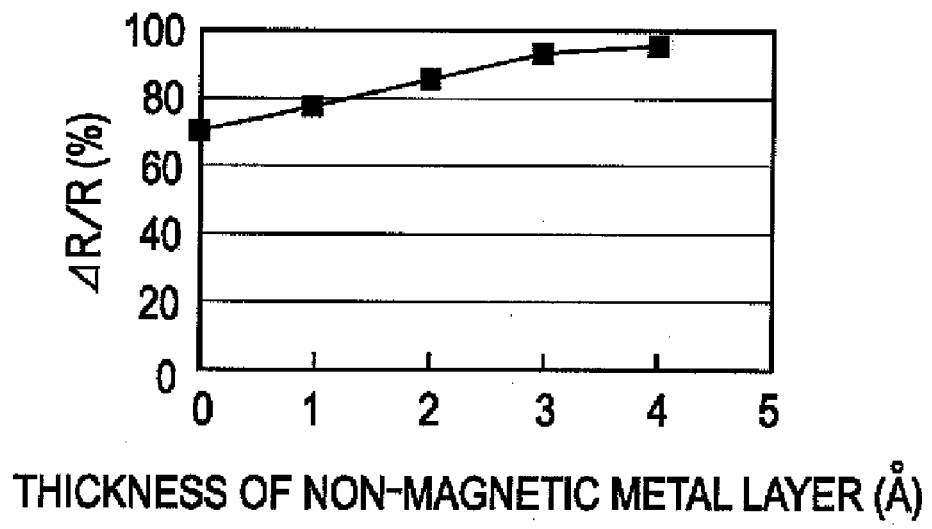
FIG. 13 is a graph showing the relationship between the resistance change rate ($\Delta R/R$) and the average thickness of the non-magnetic metal layer of the tunnel-effect type magnetic sensor according to Example 4.
Figure 14:
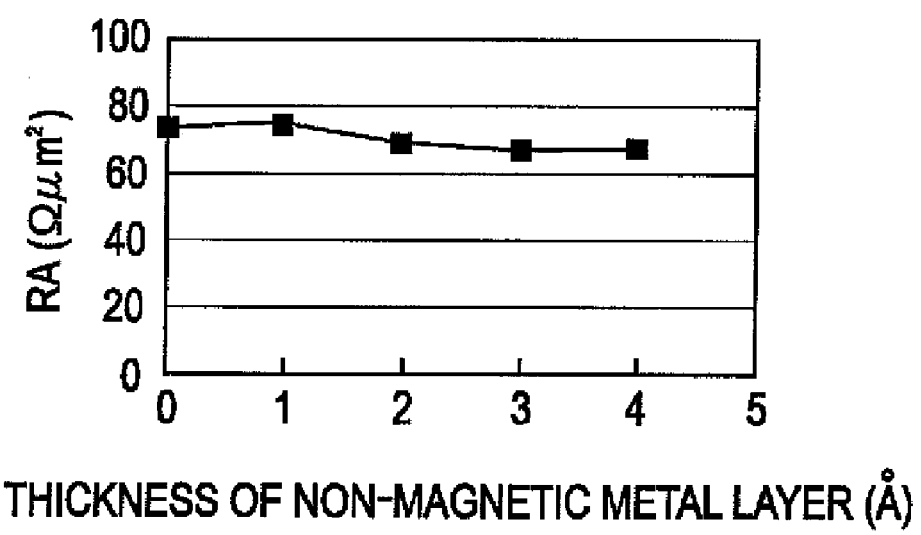
FIG. 14 is a graph showing the relationship between the RA and the average thickness of the non-magnetic metal layer of the tunnel-effect type magnetic sensor according to Example 4.

FIG. 13 is a graph showing the relationship between the resistance change rate (ΔR/R) and the average thickness of the non-magnetic metal layer 14 of the tunnel-effect type magnetic sensor obtained in Example 4. FIG. 14 is a graph showing the relationship between the RA and the average thickness of the non-magnetic metal layer 14 of the tunnel-effect type magnetic sensor obtained in Example 4.

As shown in FIG. 13, it was found that as the average thickness of the non-magnetic metal layer 14 is increased, the resistance change rate (ΔR/R) is gradually increased. On the other hand, it was found that as the average thickness of the non-magnetic metal layer 14 is increased, the RA is not changed or is slightly decreased.

From the results shown in FIGS. 12 to 14, the average thickness of the non-magnetic metal layer 14 was set in the range of 1 to 4 Å as a preferable range.

What is claimed is:

1. A tunnel-effect type magnetic sensor comprising: a laminate which includes a laminate portion composed of a fixed magnetic layer in which its magnetization direction is fixed, an insulating barrier layer, and a free magnetic layer in which its magnetization direction is changed with respect to an exterior magnetic field, the layers being laminated in that order from the bottom or from the top, wherein the insulating barrier layer is formed of Mg—O,
the free magnetic layer is formed of a plurality of soft magnetic layers which are laminated together, at least one non-magnetic metal layer provided in each place between the soft magnetic layers, and an enhancement layer which has a spin polarizability higher than that of the soft magnetic layers and which is located between the insulating barrier layer and a first soft magnetic layer, which is one of the soft magnetic layers provided at a position closest to the insulating barrier layer,
the soft magnetic layers are magnetically coupled together and are all magnetized in the same direction, and
the average thickness of the first soft magnetic layer is in the range of 5 to 60 Å.

2. The tunnel-effect type magnetic sensor according to claim 1, wherein the average thickness of the first soft magnetic layer is more than 10 Å.

3. The tunnel-effect type magnetic sensor according to claim 1, wherein the average thickness of the first soft magnetic layer is less than 20 Å.

4. The tunnel-effect type magnetic sensor according to claim 1, wherein the average thickness of the enhancement layer is in the range of 2 to 30 Å.

5. The tunnel-effect type magnetic sensor according to claim 4, wherein the average thickness of the enhancement layer is 10 Å or more.

6. The tunnel-effect type magnetic sensor according to claim 1, wherein the non-magnetic metal layer comprises at least one of Ti, V, Zr, Nb, Mo, Hf, Ta, and W.

7. The tunnel-effect type magnetic sensor according to claim 6, wherein the non-magnetic metal layer comprises Ta.

8. The tunnel-effect type magnetic sensor according to claim 1, wherein the average thickness of the non-magnetic metal layer is in the range of 1 to 4 Å.

9. The tunnel-effect type magnetic sensor according to claim 1, wherein the non-magnetic metal layer comprises a Ni—Fe alloy, and the enhancement layer comprises a Co—Fe alloy.

* * * * *